US007526348B1

(12) United States Patent
Marshall et al.

(10) Patent No.: US 7,526,348 B1
(45) Date of Patent: Apr. 28, 2009

(54) COMPUTER BASED AUTOMATIC AUDIO MIXER

(75) Inventors: John D. Marshall, Redwood City, CA (US); John C. Gaddy, 1210 Stafford Dr., Cupertino, CA (US) 95014

(73) Assignee: John C. Gaddy, Cupertino, CA (US)

( * ) Notice: Subject to any disclaimer, the term of this patent is extended or adjusted under 35 U.S.C. 154(b) by 966 days.

(21) Appl. No.: 09/751,151

(22) Filed: Dec. 27, 2000

(51) Int. Cl.
*G06F 17/00* (2006.01)
*H03G 3/00* (2006.01)
*H04B 1/00* (2006.01)

(52) U.S. Cl. .......................... 700/94; 381/119; 381/107

(58) Field of Classification Search .................. 700/94; 381/119, 102, 104–109, 56; 369/2, 4, 5, 369/47.2, 275.3
See application file for complete search history.

(56) References Cited

U.S. PATENT DOCUMENTS 2,265,097 A * 12/1941 Best .............................. 369/4
5,341,253 A 8/1994 Liao et al. ...................... 360/61
5,608,707 A 3/1997 Ogawa et al. ................. 369/84
5,621,805 A * 4/1997 Loh et al. ................... 381/119
5,768,126 A * 6/1998 Frederick ..................... 700/94
5,774,567 A * 6/1998 Heyl .......................... 381/119
5,859,826 A * 1/1999 Ueno et al. ................ 369/47.2
5,978,762 A * 11/1999 Smyth et al. ................ 704/229
6,636,609 B1 * 10/2003 Ha et al. ..................... 381/104

OTHER PUBLICATIONS

Dell PowerApp Web Server User's Guide (Mar. 10, 2000).*

* cited by examiner

*Primary Examiner*—Curtis Kuntz
*Assistant Examiner*—Andrew C Flanders
(74) *Attorney, Agent, or Firm*—Brinks Hofer Gilson & Lione

(57) ABSTRACT

A method is provided for automatic digital audio mixing of at least two digital audio files. The method comprises reading samples from the digital audio files, processing the samples to determine a scale factor for each of the files, applying the scale factors to the samples of each of their corresponding files, and summing the scaled samples to create a single digital audio output file.

111 Claims, 7 Drawing Sheets

CALCULATE SCALE FACTORS FOR TWO AUDIO FILES

*FIRST SCALE FACTOR =*

$$K / \{ PEAK1 + PEAK2 * ( \beta * RMS1 ) / (( 1 - \beta ) * RMS2 ) \}$$

*SECOND SCALE FACTOR =*

$$K / \{ PEAK2 + PEAK1 * ( \beta * RMS2 ) / (( 1 - \beta ) * RMS1 ) \}$$

FIGURE 3A (scale factor calulation for two files)

CALCULATE SCALE FACTORS FOR *N* AUDIO FILES $$\begin{bmatrix} P1 & P2 & P3 & \ldots & Pi & \ldots & PN \\ \beta 1 \cdot R1 & -\beta 2 \cdot R2 & 0 & 0 & 0 & 0 & 0 \\ \beta 1 \cdot R1 & 0 & -\beta 3 \cdot R3 & 0 & 0 & 0 & 0 \\ \beta 1 \cdot R1 & 0 & 0 & \ldots & 0 & 0 & 0 \\ \beta 1 \cdot R1 & 0 & 0 & 0 & -\beta i \cdot Ri & 0 & 0 \\ \beta 1 \cdot R1 & 0 & 0 & 0 & 0 & \ldots & 0 \\ \beta 1 \cdot R1 & 0 & 0 & 0 & 0 & 0 & -\beta N \cdot RN \end{bmatrix} X \begin{bmatrix} S1 \\ S2 \\ S3 \\ \ldots \\ Si \\ \ldots \\ SN \end{bmatrix} = \begin{bmatrix} K \\ 0 \\ 0 \\ 0 \\ 0 \\ 0 \\ 0 \end{bmatrix}$$

FIGURE 3B (scale factor calculation for *N* files)

COMPUTER BASED AUTOMATIC AUDIO MIXER

FIELD OF THE INVENTION

The present invention relates to an apparatus and a method for mixing at least two audio files. More specifically, the apparatus and methods of the present invention enable a user to achieve a professional quality sound recording without having any recording engineering training or experience.

PRIOR ART

Mixing of recorded audio programs has been performed since the advent of multiple audio track recording. Multiple track recording allows a user to record an audio performance onto a single piece of media, though each of the tracks is completely independent from one another. For example, in a two track recording the vocal track may be separately recorded onto one track while the remaining performance would be recorded onto the other track.

In order to create a multiple track recording special equipment and the knowledge of how to use the equipment is required. Typically, a recording engineer is employed to run the equipment and make the recording. An experienced recording engineer will be able to best utilize multiple track recording technology to create the best audio recordings possible.

For example, a recording engineer making a multiple track recording may record each of the tracks independently. The vocalist would be placed in the recording booth and an accompaniment track would be played back through a set of headphones so the vocalist could sing along with the track. The vocalist performs with the accompanying musical track, and the synchronization occurs naturally because the two tracks coexist on the same recording medium. After successfully making a multiple track recording, the recording engineer may apply electronic processing to each individual track to adjust the overall characteristics of the entire multiple track recording, or master recording. This processing may include balancing the instruments, adding reverberation, equalization, audio compression, noise reduction and stereo imaging. After the processing is completed, the individual tracks are combined into a mixed down stereo or monaural master. In the stereo master, several instruments or voices are combined into a pair of channels to create a stereo image.

Traditionally, the mixing process has been accomplished by an analog electronic circuit, or mixer, comprising an array of amplifiers each with its own manually adjustable volume control. The circuit includes a single summing amplifier for monaural, or a pair of summing amplifiers for stereo to linearly combine the outputs of the channel amplifiers. The individual channel volume controls can be adjusted manually during the mixing process to adjust the levels of the instruments in the mix. Using this method, individual channels may be added or removed from the overall mix. Finally, additional effects may be applied to the final mix.

With the advancements in electronics, analog mixing boards have been automated. That is the sliders that are used to control the levels of each channel amplifier have been motorized and may adjust automatically. The sliders can be controlled with a memory and a playback unit that synchronizes the mixing board with the analog recording. This allows the final mixing scheme, including all variations of the slider positions over the duration of the recording to be arranged and recorded prior to making a master recording. The final mixing scheme may then be played back while recording the final mix.

The advancements described above have been applied to digital recording systems. Digital mixing boards function in the same manner as the analog boards described above. Though, instead of utilizing analog audio signals, digital mixers are capable of utilizing digitally recorded audio material. For example, traditional analog signals are digitized to create audio files that are stored onto a computer hard drive or onto a magnetic tape or another digital storage medium. Individual mixing levels may be adjusted manually, or the mixing board may be automated as described above to reflect the manual adjustments made to the mix.

Each of the systems described above requires expensive hardware that is difficult to operate and is expensive to maintain. In order to fully utilize the functions of a mixing board, a recording engineer must have a great knowledge of the functions of the mixing board and the affect that each change will have on the overall sound of the master recording. Also, existing automated mixing systems require mixing levels to be set by the recording engineer before they can be automatically played back.

Additionally, an artist will often rent studio time in order to make a recording. Artists may themselves be capable recording engineers, but in order to make a recording the artist would have to function as both the recording engineer and the performing artist, which is very difficult, if not impossible. Therefore, in addition to renting the studio, an artist will typically employ a recording engineer to run the mixing board during the recording process, which increases the cost of making a recording.

A recent variation on the mixing methods described above has been the advent of software mixing and audio recording programs that can be run on a personal computer. As the processing power of personal computers has advanced so has the ability to utilize a computer for the mixing necessary to make a master recording. For example, a personal computer running Microsoft Windows® operating system and any one of the following audio mixing programs such as Pro Tools from Digidesign, or Vegas and Sound Forge available from Sonic Foundry, or Cool Edit Pro available from Syntrillium, or Cubase available from Steinberg can replace digital mixing boards in a recording studio. Though the personal computer software can be utilized to lower the costs of making a master recording by eliminating multiple dedicated hardware devices in a recording studio, the presently available mixing programs are still very expensive.

Also, the digital computer-based mixing programs mentioned above require an extraordinary amount of skill and knowledge to operate. Not only does the user have to be an experienced recording engineer, the user must also be able to configure a personal computer to use the mixing programs. Furthermore, many of the programs listed above include extensive user manuals, which must be read and understood before a user can maximize the performance of the software. Moreover, understanding the manuals often requires training classes and advice from customer support engineers.

A recording and mixing system is a useful tool for learning to play a musical instrument and for learning a foreign language. If a music student has an opportunity to play along with musical accompaniment and can quickly hear back a professional quality mix of his or her performance with the accompaniment, the student can adjust her or his performance, try the piece again and progress is rapid. Similarly, foreign language students benefit when they can record a phrase and compare it to that of a native speaker. As described above, the audio mixing process is traditionally a difficult one and even if the student is a skilled recording engineer, attention to the technical details of the recording and mixing process diverts the student from the task of learning to play his or her musical instrument or learning to perform a foreign language dialogue.

Therefore there is a need for a recording and mixing system that simplifies the process described above to allow music students to produce high quality recordings while keeping their focus on the music.

There is also a need to facilitate an online language lab for foreign language students that offers a method and apparatus for performing a part in a foreign language dialogue and easily mixing it with the other part of the dialogue or mixing a phrase with a matching phrase from a native speaker.

Furthermore, the cost of the equipment necessary to provide such recording and mixing functions is far out of reach of a typical music student. Therefore, it is desirable that the proposed system could be implemented on a simple personal computer requiring only a minimal amount of training and cost to users.

A primary objective of this invention is to provide an automatic mixing system that emulates the listening, analysis and adjustment processes traditionally provided by the recording engineer. That is, the object of this invention is to provide an expert system to replace the recording engineer and associated hardware.

SUMMARY OF THE INVENTION

The present invention provides a method and apparatus that automatically mixes at least two digital audio files to produce a single output file as if it were produced by a recording engineer. The method and apparatus of the present invention allows a user to utilize a relatively inexpensive personal computer as a digital recording studio. This is accomplished by operatively coupling the personal computer with a more powerful server computer via an Internet (TCP/IP) or other digital communications connection. The server computer implements expert digital audio mixing functions comprising the following components, (1) a digital audio file reading and analysis program, (2) a digital audio summing program. Alternatively, the digital mixing program of the present invention may be installed on the client computer, though preferably the mixing program is disposed on the server computer as described above.

The present invention may be used to mix any number of digital audio files. However, for simplicity, the following discussion is limited to the mixing of two files. The first file is a pre-recorded accompaniment file residing on the server, and the second is a user-recorded digital audio file transmitted to the server by software on the client computer system via a network connection. The user may have created the second digital audio file using the methods and apparatus in co-pending application entitled "SYNCHRONIZED STREAMED PLAYBACK AND RECORDING FOR PERSONAL COMPUTERS" having Ser. No. 09/750,902 filed on Dec. 27, 2000, and assigned to Timbral Research Inc, hereby incorporated in its entirety by reference. The co-pending application entitled "ONLINE COMMUNICATION SYSTEM AND METHOD FOR AURAL STUDIES" having Ser. No. 09/751,150, filed on Dec. 27, 2000, and assigned to Timbral Research Inc, hereby incorporated in its entirety by reference. describes a learning system incorporating both the recording and mixing patents. Alternatively, the user may have created the second audio file utilizing any of the above mentioned programs. Furthermore, the user may have created the second audio file using other means as described in greater detail below.

If the user-recorded audio was made using an analog audio recorder, it would have to be digitized using one of several means known in the art. Alternatively, if the audio was captured using a digital audio recording device, such as a Digital Audio Tape (DAT) recorder, a hard drive recorder, or any other digital audio recording device capable of creating a digital audio file, the digital audio file would then have to be transferred to and stored onto the client computer and transmitted to the server computer for use by the digital mixing program. The audio files may be in any format, as long as they may be read by the computer to produce simple time samples. The sample rates may differ and are converted as needed as part of the mixing process. If time alignment is critical then the starting points of each input file must possess the desired time correspondence so that after mixing they will be aligned correctly. The bit depth of the files may also differ; roundoff errors are avoided by implementing all of the computations using arithmetic with at least two (2) bits greater precision than the greatest bit depth among the input files. For example, if the highest precision file was digitized to 16 bits, then all the computations must be carried out with at least 18 bit precision.

After uploading the second digital audio file to the server, the digital mixing program reads and processes the two digital audio files twice. In the first pass the files are read and analyzed to determine scale factors to be used in the mixing process while the actual mixing is accomplished in the second pass.

The first pass is begun when the program reads the audio file headers to determine the file formats. If the digital audio files are in readable, non-compressed formats such as WAV or AU, no processing is performed at this step. However, if either or both of the files are in a compressed format such as MPEG-2 Layer III (MP3), Real Media (RM) or Quick Time (QT), the compressed file or files are expanded to a simple time sample format. At this point, all the samples from each file are processed by applying DSP routines to add audio compression, artificial reverberation, synthetic stereo imaging, etc. In this process, data are collected sample by sample for each file so that after all samples are processed, characteristic parameters are calculated for each file. Typically, these parameters include but are not limited to a peak absolute value and a root mean square (RMS) value for each processed audio file. In the case of a stereo input file or a stereo processed result from a monaural input file, the characteristic parameters are the result of examining the complete set of samples, including both the left and right channels. Alternatively, the DSP application may be bypassed during the first pass if its effect on the resulting peak absolute value and RMS value can be estimated accurately. A scale factor is then calculated for each digital audio file from their respective peak absolute values and RMS values. The scale factors are stored for application in the second pass.

The second pass begins with a second reading of samples from the input audio files and the application of DSP functions, such as audio compression, artificial reverberation, or stereo imaging. Next, if the resulting audio data files possess differing sample rates, the lower rate file is converted up to the higher sample rate or the higher rate file is converted down to the lower sample rate. This is accomplished by one of many means commonly known in the art and may be done by simple linear interpolation if the sample rates differ by an integer multiple. The resulting samples from the two files are multiplied by their respective scale factors, and then time-corresponding samples that have been processed, converted and scaled are summed. Finally, the resulting single set of samples is written to produce a single digital audio output file. The output file contains a high quality audio result in which neither audio program dominates the mix and all samples have values within the acceptable range of the output file format. For example, if one input file has higher amplitude than the other, the file with the lower amplitude will be scaled up and the file with the higher amplitude will be scaled down to normalize the amplitude of the overall mix. Still further, when mixing at least two audio files, if one file is greater in length than the other, during the mixing process the time length of the shorter audio file will be extended by appending zero-valued samples to the end of the file as necessary.

This invention further relates to machine readable media on which are stored embodiments of the present invention. It is contemplated that any media suitable for retrieving instructions is within the scope of the present invention. By way of example, such media may take the form of magnetic, optical, or semiconductor media. The invention also relates to data structures that contain embodiments of the present invention, and to the transmission of data structures containing embodiments of the present invention.

BRIEF DESCRIPTION OF THE DRAWINGS

FIG. 3A is an expanded diagram illustrating the calculation of the scale factors for two digital audio files.

FIG. 3B is an expanded diagram illustrating the method for calculating scale factors for N audio files.

DETAILED DESCRIPTION OF A PREFERRED EMBODIMENT

Though the digital mixing program 90 of the present invention will be described below in reference to a monaural signal, this should not be considered limiting in any manner. Furthermore, digital mixing program 90, can be readily applied to stereo recordings. For example, in the following description, where reference is made to determining a peak value during the analysis process, the value would be determined for a stereo file from the entire set of input samples including both left and right channels.

Figure 1A:
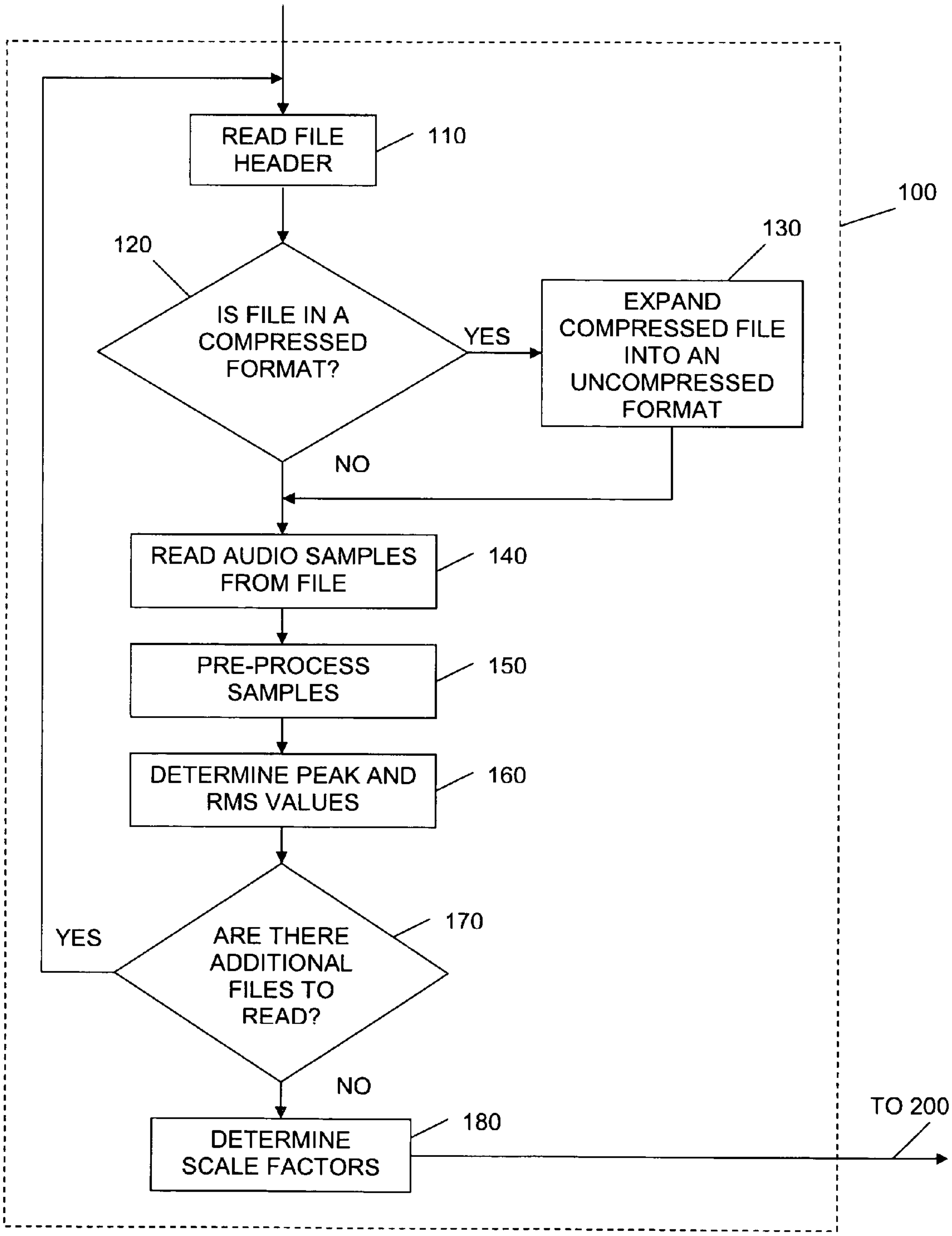
FIG. 1A is a high level function flow diagram illustrating the present invention.
Figure 1B:
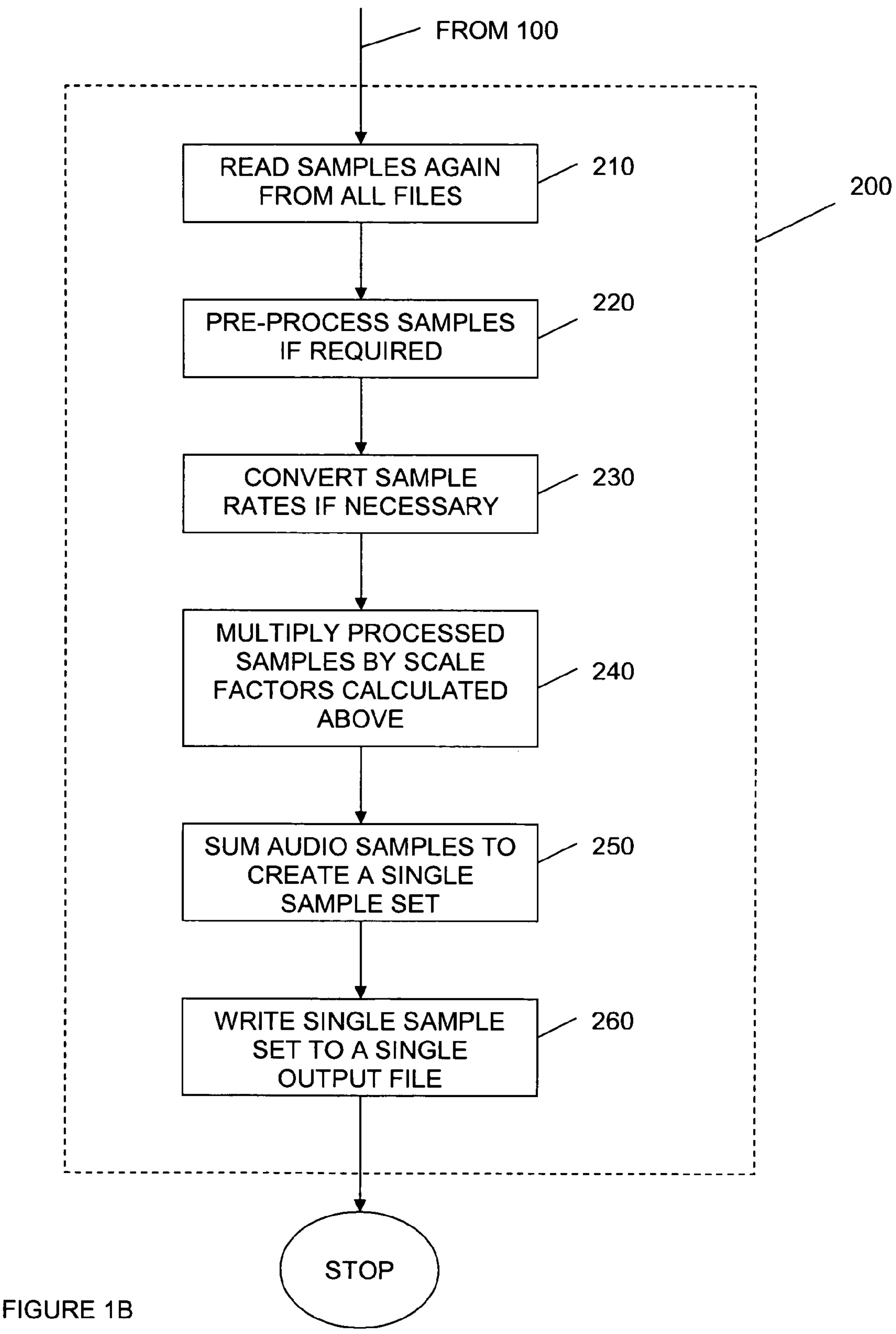
FIG. 1B is a high level function flow diagram of the present invention continued from FIG. 1A.

Referring now to FIG. 1 there is shown a high level function flow diagram of the digital mixing program 90 of the present invention. As shown in FIG. 1, digital mixing program 90 is divided into two separate boxes, BOX 100 and BOX 200. Referring now to BOX 100, upon initiation of digital mixing program 90, at BOX 110 the header of the first audio file is read and it is determined whether the file is in a compressed format.

At Diamond 120, if the file is not in a compressed format, digital mixing program 90 continues to BOX 140. If the file is in a compressed format, digital mixing program 90 proceeds to BOX 130, the file is expanded, and the program 90 continues to BOX 140.

At BOX 140, samples from the file are read.

At BOX 150 the samples are pre-processed to add reverb, stereo imaging or other DSP effects.

At BOX 160 digital mixing program 90 determines the peak absolute value attained over the duration of the pre-processed audio file and the root mean square (RMS) average of the pre-processed sample values in the file.

At Diamond 170 digital mixing program 90 checks to see if there are any additional audio files to be read. If there are, digital mixing program 90 loops to BOX 110 and repeats the operations described above until peak absolute values and RMS values are obtained for all files. When all files have been read and pre-processed as needed and their characteristic parameters (such as peak absolute value and RMS value) have been determined digital mixing program 90 advances to BOX 180 and calculates scale factors to apply to each file respectively. Digital mixing program 90 then continues to BOX 200.

At BOX 210, digital mixing program 90 reads samples from all input audio files for a second time.

At BOX 220, digital mixing program pre-processes the digital audio files a second time. The pre-processing of BOX 220 may comprise adding reverb, audio compression, applying stereo imaging, applying equalization, and pitch correction to the audio file. As before, it may be that not all audio files will require pre-processing; any files intended for pre-processing in the earlier stages of the program are pre-processed now.

At BOX 230 sample rates of the audio files are converted as needed to bring all audio data to a common sample rate using one of many methods commonly known in the art. The target sample rate is typically the highest rate among the input audio files, though it may be desirable in some instances to choose a lower target sample rate.

At BOX 240 each resulting audio file sample is multiplied by its respective scale factor and then at BOX 250 time-corresponding samples are summed to create a single sample set. At BOX 260 the single sample set is written to a single output file and digital audio program 90 stops.

Figure 2A:
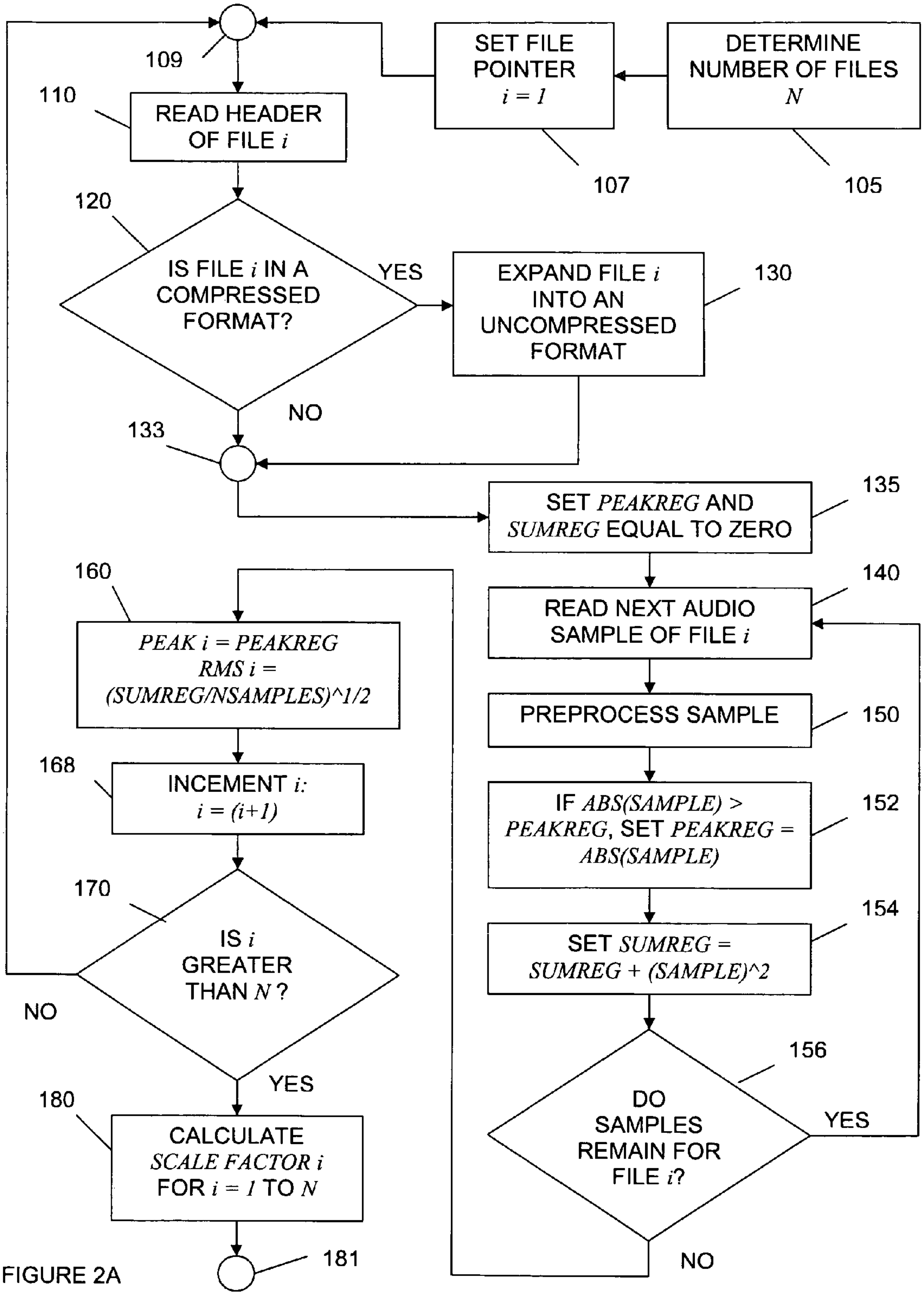
FIG. 2A is a functional flow diagram of the digital audio file reading and analysis program.

Referring now to FIG. 2A, there is shown an expanded functional block diagram illustrating digital mixing program 90, more specifically illustrating the first functional block 100 of digital mixing program 90.

At BOX 105, digital mixing program 90 determines the number of audio files (N).

At BOX 107 a file pointer variable i is set equal to 1.

At BOX 110 the digital mixing program 90 reads the header of file i (initially set to 1) to determine its type, including whether it is in a compressed format, its sample rate, duration, imaging (stereo or monaural), and any other relevant data contained in the file header.

At Diamond 120 it is determined whether audio file i is in a compressed format. If the digital audio file is in a compressed format then at BOX 130 the file is expanded into an uncompressed format and the process advances to Node 133. If the digital audio file is in an uncompressed format then digital mixing program 90 advances to Node 133.

At BOX 135 digital mixing program 90 initializes variables PEAKREG and SUMREG by setting each variable equal to zero.

At BOX 140, digital mixing program 90 reads the first sample and in subsequent loops reads the next consecutive sample contained within audio file i.

At BOX 150 the current sample of file i undergoes pre-processing. Pre-processing may comprise adding reverb to the audio file, applying audio compression, applying stereo imaging, applying equalization, and applying pitch correction to the audio file. It may be that not all files require pre-processing.

At BOX 152 digital mixing program 90 determines if the absolute value of the current pre-processed sample is greater than the value last assigned to PEAKREG. If the absolute value of the current pre-processed sample is greater than the current value of PEAKREG, then PEAKREG is set equal to the absolute value of the current pre-processed sample.

At BOX 154, digital mixing program 90 sets the value of SUMREG equal to the current value of SUMREG plus the square of the current pre-processed sample value.

At Diamond 156 it is determined whether any samples remain within audio file i. If samples remain then digital mixing program 90 loops back to BOX 140 and the process described above is repeated. If no samples remain within the digital audio file then the process advances to BOX 160.

At BOX 160 the peak absolute value of file i (PEAKi) is determined to be the current value of PEAKREG and the root mean square (RMS) value for file i (RMSi) is calculated from the current value of SUMREG according to the formula below.

$$RMSi=SQRT(SUMREG/N_{samples})$$

At BOX 168 digital mixing program increments the value of i. The value of i is incremented according to the following equation.

$$i=(i+1)$$

At Diamond 170 it is determined whether i is greater than N. If i is not greater than N then the process advances to Node 109 and the process described above is repeated starting with BOX 110 and the next audio file is processed. If i is greater than N then all files have been processed and the process advances to BOX 180.

At BOX 180 the scale factors for each audio file i are calculated. For example, suppose there are two audio files, the first file being monaural and the second being stereo, at BOX 180 two separate scale factors would be calculated. A first scale factor for the first audio file is calculated for later application to samples of the first audio file. A second scale factor is calculated for the second audio file for later application to samples of the right and left channels of the second audio file. This can be more easily understood with reference to FIGS. 3A and 3B. Referring now to FIG. 3A equations are shown for determining the scale factors for two audio files given their peak absolute values, PEAK1 and PEAK2, and their RMS values, RMS1 and RMS2, a mixing factor, β, and a constant value, K. The mixing factor, β, may take on values from zero to one but is typically set to 0.5. The constant, K, is the maximum sample value allowed by the output audio file format. Referring now to FIG. 3B a matrix equation is shown for relating the scale factors, $S_i$, for N number of audio files to the peak absolute values, $P_i$, and RMS values, $R_i$, of the files, mixing factors, $\beta_i$, and the constant, K. The mixing factors, $\beta_i$, may take on values from zero to one, so long as their sum is equal to one; K is defined as above. The scale factors are calculated by inverting the matrix equation by any of several methods commonly known in the art.

The process described in FIG. 2A and subsequent figures below may be accomplished by various other similar means. For example, the pre-processed samples created in BOX 150 of FIG. 2A were used only for calculating the peak absolute values and RMS values of the pre-processed audio data sets and were then discarded. The completion of the mixing process requires the pre-processing step to be repeated, as will be shown below.

Figure 2B:
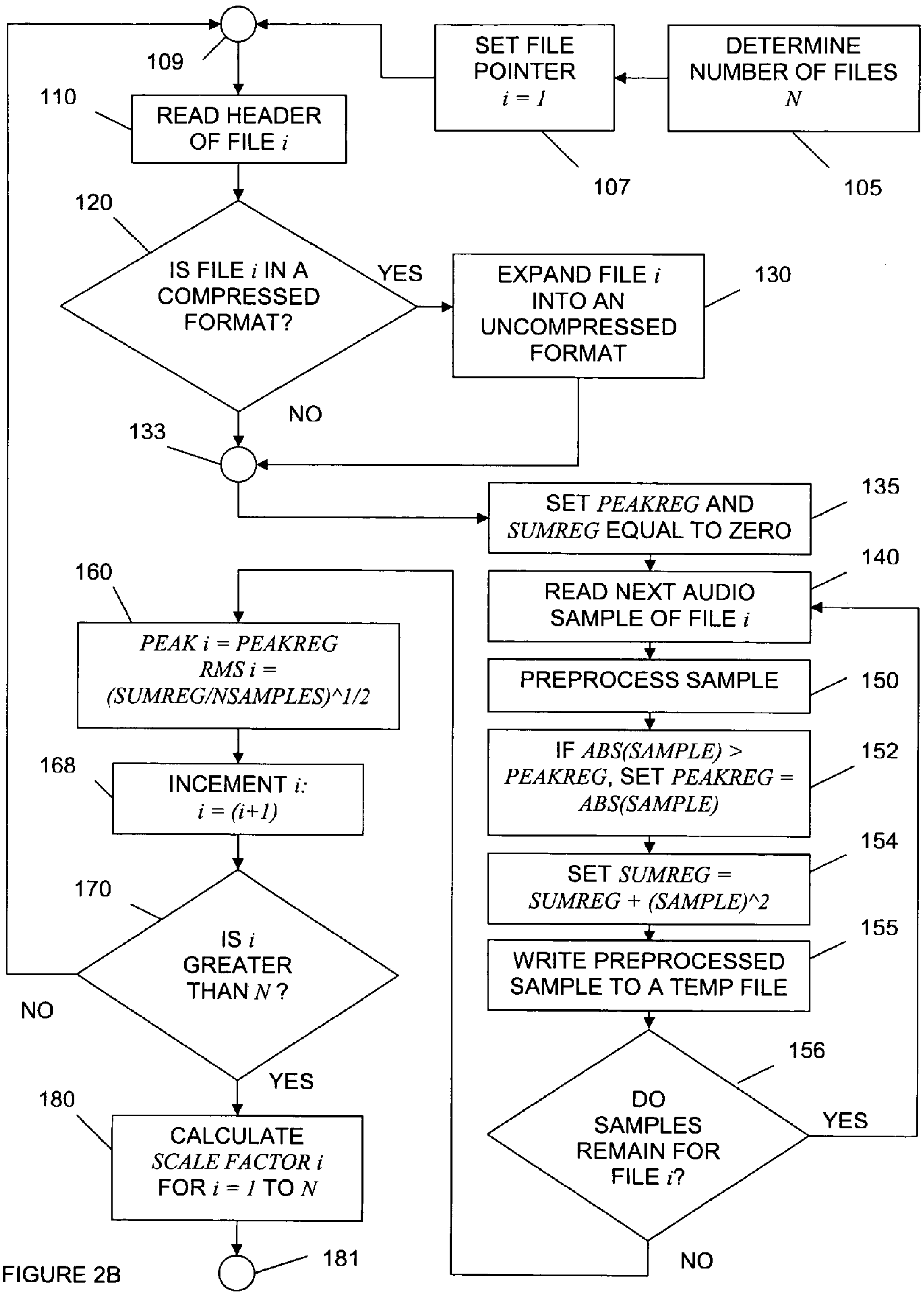
FIG. 2B is a functional flow diagram of an alternative embodiment of the digital audio mixing program of the present invention.

Referring now to FIG. 2B, there is shown an alternative embodiment of the process of FIG. 2A. The alternative embodiment depicted in FIG. 2B utilizes many of the processes described above with regard to FIG. 2A; therefore, the numbers depicting the process steps in FIG. 2B correspond to those in FIG. 2A and the description given above. With regard to the process of FIG. 2B, the processes having the same number as those described in reference to FIG. 2A are identical, except that an additional process has been added at BOX 155 in which pre-processed samples are saved to a temporary file for later use. An individual temporary file is required for saving each pre-processed file. For most pre-processing algorithms implemented in most computing systems, the time required to repeat pre-processing is far less than the time required to write and read back a temporary file, so the embodiment of FIG. 2A is preferred over that of FIG. 2B.

Figure 2C:
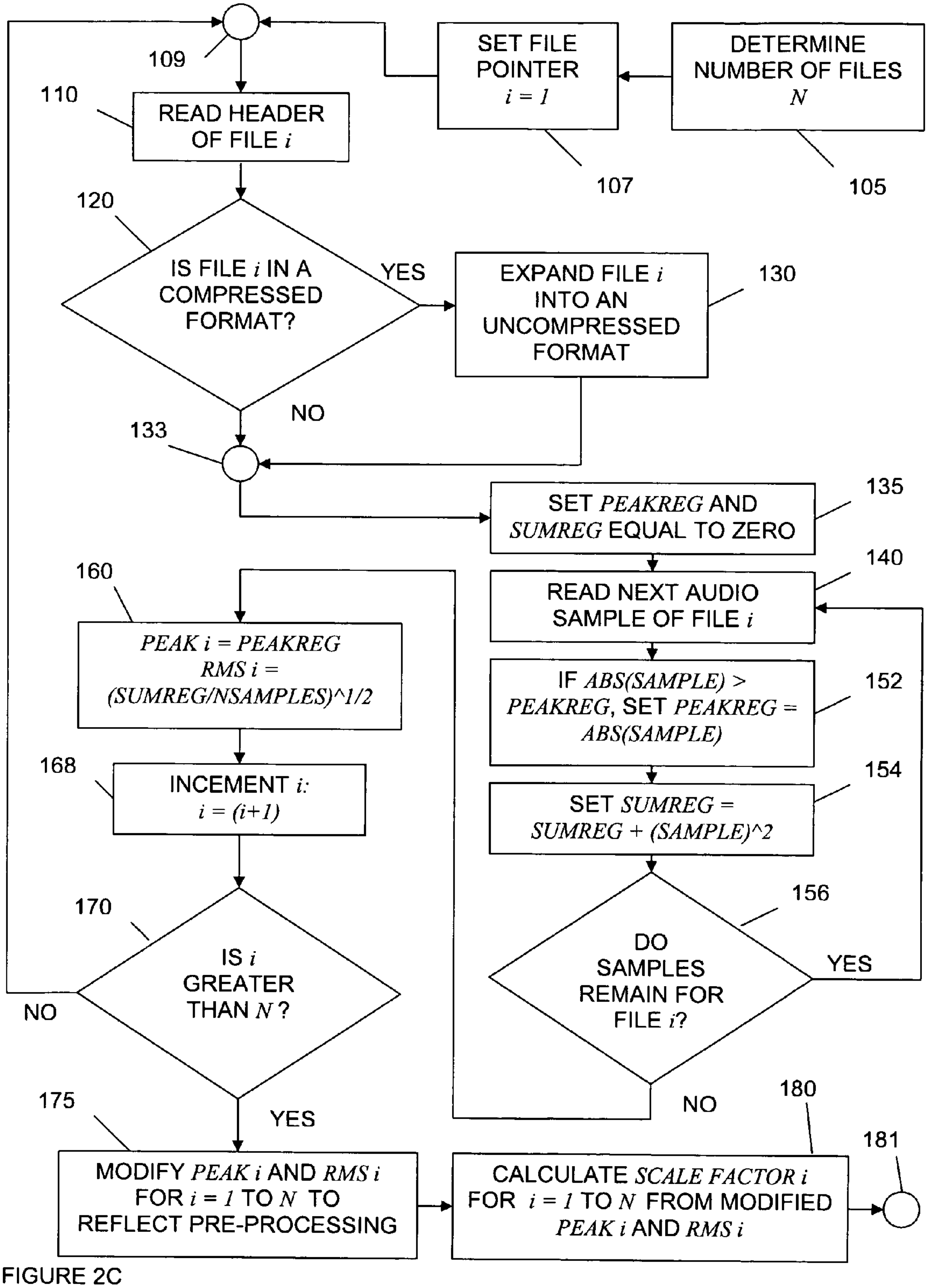
FIG. 2C is a functional flow diagram illustrating a second alternative embodiment of the digital mixing program of the present invention.

Referring now to FIG. 2C, there is shown a second alternative embodiment for the process of FIG. 2A is shown in FIG. 2C. With regard to the process of FIG. 2C, the same reference numbers of FIG. 2A have been utilized to denote processes that are identical in function and description. In this embodiment pre-processing is not performed on any file during the file reading and analysis stage. The peak absolute values and RMS values are calculated from all audio files in their unprocessed states. Instead of pre-processing first, the effects of later pre-processing are estimated and the calculated peak absolute values and RMS values are modified based on the predetermined estimate. The effects of preprocessing are predetermined by doing statistical and psychoacoustic testing to assess the effects of preprocessing on the peak absolute value, RMS value or other file characteristics of typical audio files. After file characteristics are determined they are modified to emulate the effects of pre-processing. For example, suppose that reverberation pre-processing is to be applied to a particular file before the final scaling and summation step, and it is known that the reverberation pre-processing generally increases an audio file's peak absolute value and RMS value by 50%. Then the peak absolute value and RMS value for the file to be pre-processed, calculated in BOX 160, are modified in BOX 175 by multiplying them by a factor of 1.5. The method of FIG. 2C is the most efficient of the three methods described, but introduces uncertainty in determining the scale factors unless the subsequent pre-processing algorithm is very well characterized.

Digital mixing program 90 then advances to Node 181. From Node 181, digital mixing program 90 advances to the digital audio summation program 200, illustrated previously in a simplified view in FIG. 1. The process could be accomplished as described in FIG. 1, but it would be very inefficient. Accordingly, the preferred embodiment of the invention utilizes the more efficient method described in relation to FIG. 4.

Figure 4:
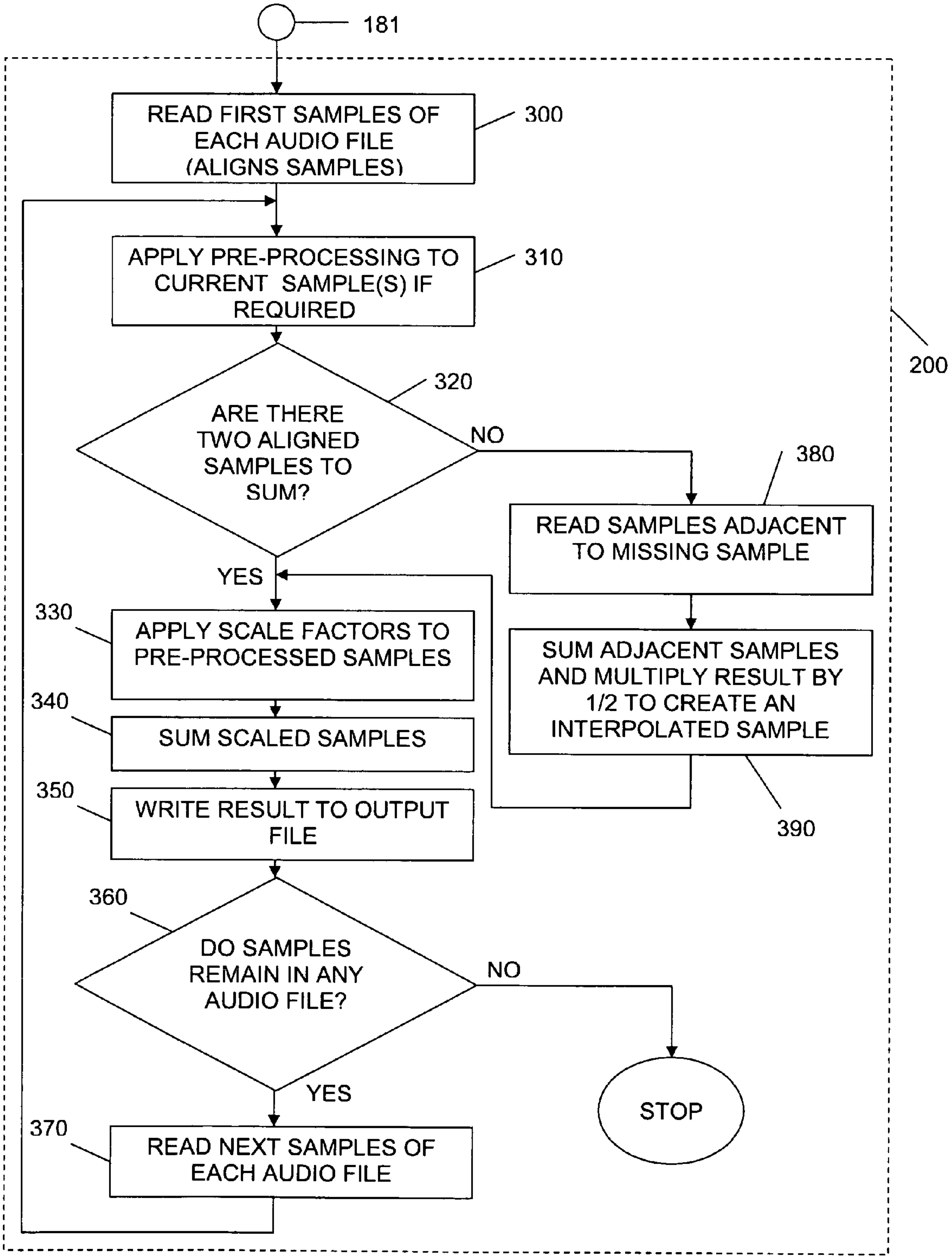
FIG. 4 is an expanded functional flow diagram of the digital audio summing program.

Referring now to FIG. 4, there is shown a preferred embodiment of BOX 200 of FIG. 1. This embodiment handles the case where only two files are to be summed and one file's sample rate is exactly twice that of the other. This is not intended to be limiting in any way and it will be clear to those skilled in the art that these techniques may be expanded to sum a larger group of files with various sampling rates.

At BOX 300 the first samples of each audio file are read, and the files are temporally aligned. At BOX 310 the pre-processing is applied to the samples if required.

At Diamond 320 it is determined whether there are two aligned samples to sum together. If there are two samples, digital mixing program 90 advances to BOX 330 where each of the samples is multiplied by its respective scale factor, calculated during the process of BOX 100, then at BOX 340 the samples are summed. This process is performed for monaural and stereo files, though for stereo files, corresponding left channel samples are scaled and summed and corresponding right channel samples are scaled and summed to create left and right output samples, respectively. Typically, for the combination of a stereo and a mono file, samples from the mono file are scaled and summed equally with corresponding scaled right and left samples of the stereo file to create right and left output samples, respectively. Digital mixing program 90 advances to BOX 350 where the summed samples from BOX 340 are saved in a single digital audio file.

At Diamond 360 the input files are examined to determine if any samples remain. If so, digital mixing program 90 advances to BOX 370 where the next samples are read. Then the digital mixing program 90 returns execution to BOX 310.

If at Diamond 320 there were not two aligned samples, the digital mixing program 90 would advance to BOX 380 to generate data for the missing sample utilizing the following process. At BOX 380, digital mixing program 90 acquires the samples preceding and succeeding the missing sample, and at BOX 390 the preceding and succeeding samples are summed and then multiplied by a factor of ½ to generate an interpolated sample. This process is undertaken for both the right and left channels if the audio file is stereo. The interpolated sample aligns with the sample from the other audio file and the samples are scaled when execution continues at BOX 330.

At Diamond 360, if it is found that one audio file has greater length than the other audio file, the shorter audio file is lengthened to match the other file by appending zero-valued samples to the shorter file. If no more samples remain in either file, the mixing process is complete and execution stops.

If the process of BOX 100 in FIG. 2 was accomplished according to the method of FIG. 2B, then in BOX 300 and BOX 370 of FIG. 4 samples are read from the temporary audio data files created in BOX 155 of FIG. 2B and the pre-processing step in BOX 310 of FIG. 4 is omitted.

Although the present invention has been described as being applied to two audio files with a two-to-one sample rate ratio, the present invention may be applied to N number of audio files with any combination of sample rates, the rates converted to a single common sample rate by any one of several commonly known methods. Additionally, the audio files utilized by the present invention may be either stereophonic or monaural. The present invention may be embodied in a client server device operatively coupled over a network for communication.

Also, although the present invention has been described with reference to an implementation utilizing the main processor of a personal computer, it will be clear to those skilled in the art that it could be implemented as a dedicated hardware subsystem with the functions described above instantiated in firmware. The resulting hardware subsystem could take the form of a dedicated digital signal processing module embedded in a server computer or a client computer or a stand-alone recording and playback device.

The invention claimed is:

1. A method for automatic digital audio mixing of at least two digital audio files, comprising:

reading said digital audio files;

automatically determining scale factors for scaling each of said digital audio files based on an analysis of said digital audio files by a digital processing unit, the analysis including identifying a peak value and a mean level for each of the digital audio files;

wherein each scale factor is based on an analysis of the entirety of each of said digital audio files relative to the other digital audio files in their entirety, the identified peak value, and the identified mean values for the digital audio files;

applying each said scale factor to the entirety of each of said digital audio files respectively; the scale factors operable to adjust the identified mean levels of the audio files to substantially equivalent levels and adjust the audio files to a recording medium maximum level to create scaled digital audio files;

combining each of said scaled digital audio files into a single audio recording output as a digital file on a storage medium; and storing the single audio recording output on a storage medium, such that it may be played back by an audio device.

2. The method of claim 1, wherein said method is performed within a server device operatively coupled over a network to a client device; wherein said automatic digital audio mixing is resident on the server and initiated upon receiving one of said digital audio files from said client device.

3. The method of claim 1, further including receiving one of said digital audio files from a user.

4. An apparatus for automatic digital audio mixing and/or mastering of at least two digital audio files, said apparatus comprising:

a means for reading said digital audio files;

a means for automatically determining scale factors for scaling each of said digital audio files based on an analysis of said digital audio files by a digital processing unit being operable to identify a peak value and an average value for each of the said digital audio files;

wherein each scale factor is based on digital audio files relative to each other, the identified peak value, and the identified average value for each of the said digital audio files;

a means for applying each said scale factor to each of said digital audio files respectively, the scale factors operable to adjust the identified average levels of the said digital audio files to a substantially equivalent level and adjust the said digital audio files to a recording medium maximum level to create scaled digital audio files;

a means for combining each of said scaled digital audio files into a single audio recording output as a digital file on a storage medium; and a means for playing back the single audio recording output.

5. The apparatus of claim 4, wherein said apparatus is a server device operatively coupled over a network to a client device; wherein said automatic digital audio mixing is resident on the server device and initiated upon receiving one of said digital audio files from said client device.

6. The apparatus of claim 4, further including means for receiving one of said digital audio files from a user.

7. A program storage device readable by a machine, tangibly embodying a program of instructions executable by the machine to perform a method for automatic digital audio mixing of at least two digital audio files, said method comprising:

reading said digital audio files;

automatically determining scale factors for scaling each of said digital audio files based on an analysis of said digital audio files by a digital processing unit, the analysis including identifying a peak value and a mean level for each of the digital audio files;

wherein each scale factor is based on an analysis of the entirety of each of said digital audio files relative to each other, the identified peak, and the identified mean values for each of the digital audio files;

applying each said scale factor to each of said digital audio files respectively, the scale factors operable to adjust the identified mean levels of the audio files to the same level and adjust the audio files to a recording medium maximum level to create scaled digital audio files;

combining each of said scaled digital audio files into a single audio recording output as a digital file on a storage medium, such that the single audio recording output may be played back.

8. The method of claim 7, wherein said method is performed within a server device operatively coupled over a network to a client device; wherein said automatic digital audio mixing is resident on the server and initiated upon receiving one of said digital audio files from said client device.

9. The method of claim 7, further including receiving one of said digital audio files from a user.

10. A method for mixing two digital audio files, the method comprising:

inputting a first digital audio file in its entirety and a second digital audio file in its entirety;

calculating, by a digital processing unit, audio file characteristic values for the first and second digital audio files, the characteristic values operable to identify average values and peak absolute values for each of the two digital audio files;

generating first and second scale factors based on the audio file characteristic values including the average levels and peak absolute values for each of the digital audio files and a maximum value allowed by an output audio file format;

generating a first scaled digital audio file by applying the first scale factor to the originally input first digital audio file, the first scale factor operable to adjust the identified average level and peak absolute value of the first digital audio file;

generating a second scaled digital audio file, which has an output level that is substantially equivalent to an output level of the first scaled digital audio file, by applying the second scale factor to the originally input second digital audio file, the second scale factor operable to adjust the identified average level and peak absolute value of the second digital audio file;

generating a combined scaled digital audio file by combining the first scaled digital audio file and the second scaled digital audio file, such that the combined scaled digital audio file may be played back.

11. The method of claim 10, wherein the said average levels are RMS averages of the first and second digital audio files.

12. The method of claim 11, wherein the said scale factors are generated by the following formulae:

$$S_1=K/(P_1+\beta_1*R_1*P_2/(\beta_2*R_2)) \text{ and } S_2=K/(P_2+\beta_2*R_2*P_1/(\beta_1*R_1))$$

where $S_1$ and $S_2$ are the scale factors to be applied to the first and second audio files, respectively, $R_1$ and $R_2$ are the calculated RMS characteristics from the first and second audio files, respectively, $\beta_1$ and $\beta_2$ are known constant values for the first and second audio files, respectively, $P_1$ and $P_2$ are the calculated peak absolute values from the first and second audio files, respectively and K is the maximum output signal level for the output file.

13. The method of claim 1, wherein each scale factor is based on a determined peak absolute value for each of said digital audio files.

14. The method of claim 1, wherein each scale factor is based on a determined root mean square for each of said digital audio files.

15. The method of claim 1, wherein each scale factor is based on a determined peak absolute value and a root mean square for each of said digital audio files.

16. The method of claim 1, further comprising bringing up an overall level of the single audio recording output to a maximum level.

17. The method of claim 16, wherein a peak of the overall level does not exceed a maximum level supported by a data format.

18. The method of claim 1 wherein the single audio recording output is a modification of the at least two digital audio files and is unable to be divided back into the individual digital audio signals.

19. The method of claim 1, wherein automatically determining scale factors comprises:

pre-processing at least one of said digital audio files to generate at least one pre-processed digital audio file, and determining a scale factor for each said pre-processed digital audio file; and wherein applying each said scale factor includes applying said scale factor to each said pre-processed digital audio file to produce scaled digital audio files.

20. The method of claim 19, wherein said method is performed within a server device operatively coupled over a network to a client device.

21. The method of claim 20, further including receiving at least one of said digital audio files from a user.

22. The method of claim 19, wherein said pre-processing comprises adding reverb to at least one of said digital audio files.

23. The method of claim 19, wherein said pre-processing comprises applying audio compression to at least one of said digital audio files.

24. The method of claim 19, wherein said pre-processing comprises applying stereo imaging to at least one of said digital audio files.

25. The method of claim 19, wherein said pre-processing comprises applying equalization to at least one of said digital audio files.

26. The method of claim 19, wherein said pre-processing comprises applying pitch correction to at least one of said digital audio files.

27. The method of claim 19, wherein at least one of said digital audio files having a compressed format is expanded into a file having an uncompressed format.

28. The method of claim 19, wherein identifying the peak value comprises identifying a peak absolute value for each of said digital audio files.

29. The method of claim 28, wherein identifying a mean level comprises identifying a root mean square for each of said digital audio files.

30. The method of claim 1, wherein automatically determining scale factors comprises:

generating modified audio file characteristics for each said digital audio files, determining a scale factor for each said digital audio file from said modified audio file characteristics, and pre-processing at least one of said digital audio files to generate at least one pre-processed digital audio file; and wherein applying each said scale factor for each said pre-processed digital audio file comprises: applying said scale factors to each of said pre-processed digital audio files.

31. The method of claim 30, wherein said pre-processing further comprises adding reverb to at least one of said digital audio files.

32. The method of claim 30, wherein said pre-processing further comprises applying audio compression to at least one of said digital audio files.

33. The method of claim 30, wherein said pre-processing further comprises applying stereo imaging to at least one of said digital audio files.

34. The method of claim 30, wherein said pre-processing further comprises applying equalization to at least one of said digital audio files.

35. The method of claim 30, wherein at least one of said digital audio files having a compressed format is expanded into a file having an uncompressed format.

36. The method of claim 30, wherein identifying a peak value comprises identifying a peak absolute value for each of said digital audio files.

37. The method of claim 36, wherein identifying a peak value comprises identifying a root mean square for each of said digital audio files.

38. The method of claim 1, wherein automatically determining scale factors comprises:

pre-processing at least one of said digital audio files during said analysis of the digital audio files to produce at least one pre-processed digital audio file, and determining a scale factor for each said pre-processed digital audio file and for each said digital audio file, not having been pre-processed; and wherein applying each said scale factor comprises: applying the scale factor for each said pre-processed digital audio file to each said pre-processed digital audio file to produce a scaled pre-processed digital audio file and the scale factor for each said digital audio file, not having been pre-processed, to each said digital audio file not having been pre-processed to produce a scaled digital audio file.

39. The method of claim 38, wherein said pre-processing comprises adding reverb to at least one of said digital audio files.

40. The method of claim 38, wherein said pre-processing comprises applying audio compression to at least one of said digital audio files.

41. The method of claim 38, wherein said pre-processing comprises applying stereo imaging to at least one of said digital audio files.

42. The method of claim 38, wherein said pre-processing comprises applying equalization to at least one of said digital audio files.

43. The method of claim 38, wherein said pre-processing comprises applying pitch correction to at least one of said digital audio files.

44. The method of claim 38, wherein at least one of said digital audio files having a compressed format is expanded into a file having an uncompressed format.

45. The method of claim 38, wherein identifying a peak value comprises identifying a peak absolute value for at least one of said digital audio files.

46. The method of claim 45, wherein identifying a mean level comprises identifying a root mean square for at least one of said digital audio files.

47. The apparatus of claim 4, wherein the means for automatically determining scale factors is operable for:

pre-processing at least one of said digital audio files to generate at least one pre-processed digital audio file, and determining a scale factor for each said pre-processed digital audio file; and wherein the means for applying is operable for: applying said scale factor for each said pre-processed digital audio file to each said pre-processed digital audio file to produce scaled digital audio files.

48. The apparatus of claim 47, wherein said method is performed within a server device operatively coupled over a network to a client device.

49. The method of claim 47, further including receiving one of said digital audio files from a user.

50. The apparatus of claim 47, wherein said pre-processing comprises adding reverb to at least one of said digital audio files.

51. The apparatus of claim 47, wherein said pre-processing comprises applying stereo imaging to at least one of said digital audio files.

52. The apparatus of claim 47, wherein said pre-processing comprises applying equalization to at least one of said digital audio files.

53. The apparatus of claim 47, wherein said pre-processing comprises applying pitch correction to at least one of said digital audio files.

54. The apparatus of claim 47, wherein at least one of said digital audio files having a compressed format is expanded into a file having an uncompressed format.

55. The apparatus of claim 47, wherein identifying the peak value comprises identifying a peak absolute value for at least one of said digital audio files.

56. The apparatus of claim 55, wherein identifying the average value comprises identifying a root mean square for at least one of said digital audio files.

57. The apparatus of claim 4, wherein the means for automatically determining scale factors is operable for:

modifying characteristics of said digital audio files to generate modified audio file characteristics;

determining a scale factor for said digital audio file from said modified audio file characteristics; and pre-processing at least one of said digital audio files to generate at least one pre-processed digital audio file.

58. The apparatus of claim 57, wherein said pre-processing comprises applying said scale factors to said digital audio files respectively.

59. The apparatus of claim 58, wherein said pre-processing further comprises adding reverb to at least one of said digital audio files.

60. The apparatus of claim 58, wherein said pre-processing further comprises applying audio compression to at least one of said digital audio files.

61. The apparatus of claim 58, wherein said pre-processing further comprises applying stereo imaging to at least one of said digital audio files.

62. The apparatus of claim 58, wherein said pre-processing further comprises applying equalization to at least one of said digital audio files.

63. The apparatus of claim 57, wherein at least one of said digital audio files having a compressed format is expanded into a file having an uncompressed format.

64. The apparatus of claim 58, wherein identifying the peak value comprises a peak absolute value for at least one of said digital audio files.

65. The apparatus of claim 64, wherein identifying the average value comprises identifying a root mean square for at least one of said digital audio files.

66. The apparatus of claim 4, wherein the means for automatically determining scale factors is operable for:

pre-processing at least one of said digital audio files during said analysis to produce at least one pre-processed digital audio file, and determining a scale factor for said at least one pre-processed digital audio file and for each said digital audio file, not having been pre-processed;

wherein the means for applying said scale factor is operable for: applying the scale factor for each said pre-processed digital audio file to each said pre-processed digital audio file, to produce a scaled pre-processed digital audio file and applying the scale factor for each said digital audio file, not having been pre-processed, to each said digital audio file not having been pre-processed to produce a scaled digital audio file; and wherein the means for combining is operable for: combining said scaled pre-processed digital audio files and said scaled digital audio files into a single digital audio file.

67. The apparatus of claim 66, wherein said pre-processing comprises adding reverb to at least one of said digital audio files.

68. The apparatus of claim 66, wherein said pre-processing comprises applying audio compression to at least one of said digital audio files.

69. The apparatus of claim 66, wherein said pre-processing comprises applying stereo imaging to at least one of said digital audio files.

70. The apparatus of claim 66, wherein said pre-processing comprises applying equalization to at least one of said digital audio files.

71. The apparatus of claim 66, wherein said pre-processing comprises applying pitch correction to at least one of said digital audio files.

72. The apparatus of claim 66, wherein at least one of said digital audio files having a compressed format is expanded into a file having an uncompressed format.

73. The apparatus of claim 66, wherein identifying the peak value comprises identifying a peak absolute value for at least one of said digital audio files.

74. The apparatus of claim 73, wherein identifying the average value comprises identifying a root mean square for at least one of said digital audio files.

75. The method of claim 7, wherein automatically determining scale factors comprises:

pre-processing at least one of said digital audio files to generate at least one pre-processed digital audio file, and determining a scale factor for each said at least one pre-processed digital audio file; and wherein applying each said scale factor comprises: applying said scale factor for each said at least one pre-processed digital audio file to said pre-processed digital audio files to produce scaled digital audio files.

76. The method of claim 75, wherein said method is performed within a server device operatively coupled over a network to a client device.

77. The method of claim 75, further including receiving one of said digital audio files from a user.

78. The method of claim 75, wherein said pre-processing comprises adding reverb to at least one of said digital audio files.

79. The method of claim 75, wherein said pre-processing comprises applying audio compression to at least one of said digital audio files.

80. The method of claim 75, wherein said pre-processing comprises applying stereo imaging to at least one of said digital audio files.

81. The method of claim 75, wherein said pre-processing comprises applying equalization to at least one of said digital audio files.

82. The method of claim 75, wherein said pre-processing comprises applying pitch correction to at least one of said digital audio files.

83. The method of claim 75, wherein at least one of said digital audio files having a compressed format is expanded into a file having an uncompressed format.

84. The method of claim 75, wherein identifying the peak value comprises identifying a peak absolute value for at least one of said digital audio files.

85. The method of claim 84, wherein identifying the mean level comprises a root mean square for at least one of said digital audio files.

86. The method of claim 7, wherein automatically determining scale factors comprises:

determining characteristics for each said digital audio files;

modifying at least one of said characteristics of said digital audio files to generate modified audio file characteristics;

determining a scale factor for each said digital audio file from said modified audio file characteristics, and pre-processing at least one of said digital audio files to generate at least one pre-processed digital audio file; and wherein applying each said scale factor comprises: applying said scale factors for each said digital audio file from said modified audio file characteristics to each of said pre-processed digital audio files.

87. The method of claim 86, wherein the at least one pre-processed digital audio file is a modified digital audio file.

88. The method of claim 86, wherein said pre-processing further comprises adding reverb to at least one of said digital audio files.

89. The method of claim 86, wherein said pre-processing further comprises applying audio compression to at least one of said digital audio files.

90. The method of claim 86, wherein said pre-processing further comprises applying stereo imaging to at least one of said digital audio files.

91. The method of claim 86, wherein said pre-processing further comprises applying equalization to at least one of said digital audio files.

92. The method of claim 86, wherein at least one of said digital audio files having a compressed format is expanded into a file having an uncompressed format.

93. The method of claim 87, wherein identifying the peak value comprises identifying a peak absolute value for at least one of said digital audio files.

94. The method of claim 93, wherein identifying the mean level comprises identifying a root mean square for at least one of said digital audio files.

95. The method of claim 7, wherein automatically determining scale factors comprises:

pre-processing at least one of said digital audio files to produce at least one pre-processed digital audio file, and determining a scale factor for each said pre-processed digital audio file and for each said digital audio file, not having been pre-processed;

wherein applying each said scale factor comprises: applying said scale factor for each said pre-processed digital audio file to each said pre-processed digital audio file, to produce a scaled pre-processed digital audio file and applying said scale factor for the said digital audio file not having been pre-processed to each said digital audio file not having been pre-processed to produce a scaled digital audio file; and wherein combining each of said scaled digital audio files comprises: combining said scaled pre-processed digital audio files and said scaled digital audio files into a single digital audio file.

96. The method of claim 95, wherein said pre-processing comprises adding reverb to at least one of said digital audio files.

97. The method of claim 95, wherein said pre-processing comprises applying audio compression to at least one of said digital audio files.

98. The method of claim 95, wherein said pre-processing comprises applying stereo imaging to at least one of said digital audio files.

99. The method of claim 95, wherein said pre-processing comprises applying equalization to at least one of said digital audio files.

100. The method of claim 95, wherein said pre-processing comprises applying pitch correction to at least one of said digital audio files.

101. The method of claim 95, wherein identifying the peak value comprises identifying a peak absolute value for at least one of said digital audio files.

102. The method of claim 95, wherein identifying the mean level comprises identifying a root mean square for at least one of said digital audio files.

103. The method of claim 29, wherein determination of said scale factors for N number of digital audio files, wherein N represents the number of audio files, $\beta_i$ represents a known constant value for each said digital audio file, $P_i$ represents the peak absolute value for each said digital audio file, $R_i$ is the root mean square value for each said digital audio file, K is a known constant, $S_i$ represents the calculated scale factor for each said digital audio file and i takes on an integer value from 1 to N, said scale factors being determined by the following equation, $$\begin{bmatrix} P_1 & P_2 & P_3 & \dots & P_i & \dots & P_N \\ \beta_1 R_1 & -\beta_2 R_2 & 0 & \dots & 0 & \dots & 0 \\ \beta_1 R_1 & 0 & -\beta_3 R_3 & \dots & 0 & \dots & 0 \\ \dots & \dots & \dots & \dots & 0 & \dots & \dots \\ \beta_1 R_1 & 0 & 0 & 0 & -\beta_i R_i & 0 & 0 \\ \dots & \dots & \dots & \dots & 0 & \dots & \dots \\ \beta_1 R_1 & 0 & 0 & \dots & 0 & \dots & -\beta_N R_N \end{bmatrix} \times \begin{bmatrix} S_1 \\ S_2 \\ S_3 \\ \dots \\ S_i \\ \dots \\ S_N \end{bmatrix} = \begin{bmatrix} K \\ 0 \\ 0 \\ \dots \\ 0 \\ \dots \\ 0 \end{bmatrix}.$$

104. The method of claim 37, wherein determination of said scale factors for N number of digital audio files, wherein N represents the number of audio files, $\beta_i$ represents a known constant value for each said digital audio file, $P_i$; represents the peak absolute value for each said digital audio file, $R_i$; is the root mean square value for each said digital audio file, K is a known constant, $S_i$; represents the calculated scale factor for each said digital audio file and i takes on an integer value from 1 to N, said scale factors being determined by the following equation, $$\begin{bmatrix} P_1 & P_2 & P_3 & \dots & P_i & \dots & P_N \\ \beta_1 R_1 & -\beta_2 R_2 & 0 & \dots & 0 & \dots & 0 \\ \beta_1 R_1 & 0 & -\beta_3 R_3 & \dots & 0 & \dots & 0 \\ \dots & \dots & \dots & \dots & 0 & \dots & \dots \\ \beta_1 R_1 & 0 & 0 & 0 & -\beta_i R_i & 0 & 0 \\ \dots & \dots & \dots & \dots & 0 & \dots & \dots \\ \beta_1 R_1 & 0 & 0 & \dots & 0 & \dots & -\beta_N R_N \end{bmatrix} \times \begin{bmatrix} S_1 \\ S_2 \\ S_3 \\ \dots \\ S_i \\ \dots \\ S_N \end{bmatrix} = \begin{bmatrix} K \\ 0 \\ 0 \\ \dots \\ 0 \\ \dots \\ 0 \end{bmatrix}.$$

105. The method of claim 46, wherein determination of said scale factors for N number of digital audio files, wherein N represents the number of audio files, $\beta_i$ represents a known constant value for each said digital audio file, $P_i$ represents the peak absolute value for each said digital audio file, $R_i$ is the root mean square value for each said digital audio file, K is a known constant, $S_i$ represents the calculated scale factor for each said digital audio file and i takes on an integer value from 1 to N, said scale factors being determined by the following equation, $$\begin{bmatrix} P_1 & P_2 & P_3 & \dots & P_i & \dots & P_N \\ \beta_1 R_1 & -\beta_2 R_2 & 0 & \dots & 0 & \dots & 0 \\ \beta_1 R_1 & 0 & -\beta_3 R_3 & \dots & 0 & \dots & 0 \\ \dots & \dots & \dots & \dots & 0 & \dots & \dots \\ \beta_1 R_1 & 0 & 0 & 0 & -\beta_i R_i & 0 & 0 \\ \dots & \dots & \dots & \dots & 0 & \dots & \dots \\ \beta_1 R_1 & 0 & 0 & \dots & 0 & \dots & -\beta_N R_N \end{bmatrix} \times \begin{bmatrix} S_1 \\ S_2 \\ S_3 \\ \dots \\ S_i \\ \dots \\ S_N \end{bmatrix} = \begin{bmatrix} K \\ 0 \\ 0 \\ \dots \\ 0 \\ \dots \\ 0 \end{bmatrix}.$$

106. The apparatus of claim 56, wherein determination of said scale factors for N number of digital audio files, wherein N represents the number of audio files, $\beta_i$ represents a known constant value for each said digital audio file, $P_i$ represents the peak absolute value for each said digital audio file, $R_i$ is the root mean square value for each said digital audio file, K is a known constant, $S_i$ represents the calculated scale factor for each said digital audio file and i takes on an integer value from 1 to N said scale factors being determined by the following equation, $$\begin{bmatrix} P_1 & P_2 & P_3 & \cdots & P_i & \cdots & P_N \\ \beta_1 R_1 & -\beta_2 R_2 & 0 & \cdots & 0 & \cdots & 0 \\ \beta_1 R_1 & 0 & -\beta_3 R_3 & \cdots & 0 & \cdots & 0 \\ \cdots & \cdots & \cdots & \cdots & 0 & \cdots & \cdots \\ \beta_1 R_1 & 0 & 0 & 0 & -\beta_i R_i & 0 & 0 \\ \cdots & \cdots & \cdots & \cdots & 0 & \cdots & \cdots \\ \beta_1 R_1 & 0 & 0 & \cdots & 0 & \cdots & -\beta_N R_N \end{bmatrix} \times \begin{bmatrix} S_1 \\ S_2 \\ S_3 \\ \cdots \\ S_i \\ \cdots \\ S_N \end{bmatrix} = \begin{bmatrix} K \\ 0 \\ 0 \\ \cdots \\ 0 \\ \cdots \\ 0 \end{bmatrix}.$$

107. The apparatus of claim 65, wherein determination of said scale factors for N number of digital audio files, wherein N represents the number of audio files, $\beta_i$ represents a known constant value for each said digital audio file, $P_i$; represents the peak absolute value for each said digital audio file, $R_i$ is the root mean square value for each said digital audio file, K is a known constant, $S_i$ represents the calculated scale factor for each said digital audio file and i takes on an integer value from 1 to N, said scale factors being determined by the following equation, $$\begin{bmatrix} P_1 & P_2 & P_3 & \cdots & P_i & \cdots & P_N \\ \beta_1 R_1 & -\beta_2 R_2 & 0 & \cdots & 0 & \cdots & 0 \\ \beta_1 R_1 & 0 & -\beta_3 R_3 & \cdots & 0 & \cdots & 0 \\ \cdots & \cdots & \cdots & \cdots & 0 & \cdots & \cdots \\ \beta_1 R_1 & 0 & 0 & 0 & -\beta_i R_i & 0 & 0 \\ \cdots & \cdots & \cdots & \cdots & 0 & \cdots & \cdots \\ \beta_1 R_1 & 0 & 0 & \cdots & 0 & \cdots & -\beta_N R_N \end{bmatrix} \times \begin{bmatrix} S_1 \\ S_2 \\ S_3 \\ \cdots \\ S_i \\ \cdots \\ S_N \end{bmatrix} = \begin{bmatrix} K \\ 0 \\ 0 \\ \cdots \\ 0 \\ \cdots \\ 0 \end{bmatrix}.$$

108. The apparatus of claim 74, wherein determination of said scale factors for N number of digital audio files, wherein N represents the number of audio files, $\beta_i$ represents a known constant value for each said digital audio file, $P_i$ represents the peak absolute value for each said digital audio file, $R_i$ is the root mean square value for each said digital audio file, K is a known constant, $S_i$ represents the calculated scale factor for each said digital audio file and i takes on an integer value from 1 to N, said scale factors being determined by the following equation, $$\begin{bmatrix} P_1 & P_2 & P_3 & \cdots & P_i & \cdots & P_N \\ \beta_1 R_1 & -\beta_2 R_2 & 0 & \cdots & 0 & \cdots & 0 \\ \beta_1 R_1 & 0 & -\beta_3 R_3 & \cdots & 0 & \cdots & 0 \\ \cdots & \cdots & \cdots & \cdots & 0 & \cdots & \cdots \\ \beta_1 R_1 & 0 & 0 & 0 & -\beta_i R_i & 0 & 0 \\ \cdots & \cdots & \cdots & \cdots & 0 & \cdots & \cdots \\ \beta_1 R_1 & 0 & 0 & \cdots & 0 & \cdots & -\beta_N R_N \end{bmatrix} \times \begin{bmatrix} S_1 \\ S_2 \\ S_3 \\ \cdots \\ S_i \\ \cdots \\ S_N \end{bmatrix} = \begin{bmatrix} K \\ 0 \\ 0 \\ \cdots \\ 0 \\ \cdots \\ 0 \end{bmatrix}.$$

109. The method of claim 85, wherein determination of said scale factors for N number of digital audio files, wherein N represents the number of audio files, $\beta_i$ represents a known constant value for each said digital audio file, $P_i$; represents the peak absolute value for each said digital audio file, $R_i$ is the root mean square value for each said digital audio file, K is a known constant, $S_i$ represents the calculated scale factor for each said digital audio file and i takes on an integer value from 1 to N, said scale factors being determined by the following equation, $$\begin{bmatrix} P_1 & P_2 & P_3 & \cdots & P_i & \cdots & P_N \\ \beta_1 R_1 & -\beta_2 R_2 & 0 & \cdots & 0 & \cdots & 0 \\ \beta_1 R_1 & 0 & -\beta_3 R_3 & \cdots & 0 & \cdots & 0 \\ \cdots & \cdots & \cdots & \cdots & 0 & \cdots & \cdots \\ \beta_1 R_1 & 0 & 0 & 0 & -\beta_i R_i & 0 & 0 \\ \cdots & \cdots & \cdots & \cdots & 0 & \cdots & \cdots \\ \beta_1 R_1 & 0 & 0 & \cdots & 0 & \cdots & -\beta_N R_N \end{bmatrix} \times \begin{bmatrix} S_1 \\ S_2 \\ S_3 \\ \cdots \\ S_i \\ \cdots \\ S_N \end{bmatrix} = \begin{bmatrix} K \\ 0 \\ 0 \\ \cdots \\ 0 \\ \cdots \\ 0 \end{bmatrix}.$$

110. The method of claim 94, wherein determination of said scale factors for N number of digital audio files, wherein N represents the number of audio files, $\beta_i$ represents a known constant value for each said digital audio file, $P_i$; represents the peak absolute value for each said digital audio file, $R_i$; is the root mean square value for each said digital audio file, K is a known constant, $S_i$ represents the calculated scale factor for each said digital audio file and i takes on an integer value from 1 to N, said scale factors being determined by the following equation, $$\begin{bmatrix} P_1 & P_2 & P_3 & \cdots & P_i & \cdots & P_N \\ \beta_1 R_1 & -\beta_2 R_2 & 0 & \cdots & 0 & \cdots & 0 \\ \beta_1 R_1 & 0 & -\beta_3 R_3 & \cdots & 0 & \cdots & 0 \\ \cdots & \cdots & \cdots & \cdots & 0 & \cdots & \cdots \\ \beta_1 R_1 & 0 & 0 & 0 & -\beta_i R_i & 0 & 0 \\ \cdots & \cdots & \cdots & \cdots & 0 & \cdots & \cdots \\ \beta_1 R_1 & 0 & 0 & \cdots & 0 & \cdots & -\beta_N R_N \end{bmatrix} \times \begin{bmatrix} S_1 \\ S_2 \\ S_3 \\ \cdots \\ S_i \\ \cdots \\ S_N \end{bmatrix} = \begin{bmatrix} K \\ 0 \\ 0 \\ \cdots \\ 0 \\ \cdots \\ 0 \end{bmatrix}.$$

111. The method of claim 102, wherein determination of said scale factors for N number of digital audio files, wherein N represents the number of audio files, $\beta_i$ represents a known constant value for each said digital audio file, $P_i$; represents the peak absolute value for each said digital audio file, $R_i$; is the root mean square value for each said digital audio file, K is a known constant, $S_i$ represents the calculated scale factor for each said digital audio file and i takes on an integer value from 1 to N, said scale factors being determined by the following equation, $$\begin{bmatrix} P_1 & P_2 & P_3 & \cdots & P_i & \cdots & P_N \\ \beta_1 R_1 & -\beta_2 R_2 & 0 & \cdots & 0 & \cdots & 0 \\ \beta_1 R_1 & 0 & -\beta_3 R_3 & \cdots & 0 & \cdots & 0 \\ \cdots & \cdots & \cdots & \cdots & 0 & \cdots & \cdots \\ \beta_1 R_1 & 0 & 0 & 0 & -\beta_i R_i & 0 & 0 \\ \cdots & \cdots & \cdots & \cdots & 0 & \cdots & \cdots \\ \beta_1 R_1 & 0 & 0 & \cdots & 0 & \cdots & -\beta_N R_N \end{bmatrix} \times \begin{bmatrix} S_1 \\ S_2 \\ S_3 \\ \cdots \\ S_i \\ \cdots \\ S_N \end{bmatrix} = \begin{bmatrix} K \\ 0 \\ 0 \\ \cdots \\ 0 \\ \cdots \\ 0 \end{bmatrix}.$$

* * * * *